(12) United States Patent
Hirano

(10) Patent No.: US 7,120,025 B2
(45) Date of Patent: Oct. 10, 2006

(54) IMAGING APPARATUS

(75) Inventor: Ryuichi Hirano, Hachioji (JP)

(73) Assignee: Olympus Corporation, Tokyo (JP)

( * ) Notice: Subject to any disclaimer, the term of this patent is extended or adjusted under 35 U.S.C. 154(b) by 184 days.

(21) Appl. No.: 10/957,860

(22) Filed: Oct. 4, 2004

(65) Prior Publication Data
US 2005/0073815 A1    Apr. 7, 2005

(30) Foreign Application Priority Data
Oct. 6, 2003    (JP)    ............... 2003-347315

(51) Int. Cl.
*H05K 7/20*    (2006.01)
(52) U.S. Cl. ............... 361/704; 257/712; 348/374
(58) Field of Classification Search ............... None
See application file for complete search history.

(56) References Cited
U.S. PATENT DOCUMENTS 5,508,740 A * 4/1996 Miyaguchi et al. ......... 348/244

5,703,352 A * 12/1997 Snoeren et al. .......... 250/208.1
6,307,590 B1 * 10/2001 Yoshida ..................... 348/340
6,400,011 B1 * 6/2002 Miki .......................... 257/712
2004/0075870 A1 * 4/2004 Karaki ........................ 358/296
2004/0169771 A1 * 9/2004 Washington et al. ........ 348/374

FOREIGN PATENT DOCUMENTS

| JP | 5-46381 Y2 | 12/1993 |
| JP | 7-211823 A | 8/1995 |
| JP | 2005204062 A * | 7/2005 |

\* cited by examiner

*Primary Examiner*—Boris Chervinsky
(74) *Attorney, Agent, or Firm*—Frishauf, Holtz, Goodman & Chick, P.C.

(57) ABSTRACT

An imaging apparatus comprises an imaging device which images an image, an exterior member which contains the imaging device, an interior member which is arranged inside of the exterior member and contains the imaging device, a heat insulator arranged between the exterior member and the interior member, for thermally insulating between the exterior member and the interior member, and a cooling unit configured to cool the imaging device and the interior member respectively and radiating heat that is absorbed from the imaging device and the interior member to the exterior member independently.

10 Claims, 3 Drawing Sheets

IMAGING APPARATUS

CROSS-REFERENCE TO RELATED APPLICATIONS

This application is based upon and claims the benefit of priority from prior Japanese Patent Application No. 2003-347315, filed Oct. 6, 2003, the entire contents of which are incorporated herein by reference.

BACKGROUND OF THE INVENTION

1. Field of the Invention

The present invention relates to an imaging apparatus including a cooling function and a dew condensation prevention function of an imaging device.

2. Description of the Related Art

Conventionally, according to an imaging apparatus for imaging by using a solid-state imaging device, it has been known that an image is deteriorated as a temperature of the solid-state imaging device becomes higher.

Therefore, in the case of using such a solid-state imaging device, an imaging device is entirely cooled in order to prevent the temperature of the solid-state imaging device from being increased. As cooling means for this purpose, for example, a Peltier element has been known.

FIG. 1 shows a conventional imaging apparatus including a cooling structure using a Peltier element.

In FIG. 1, a solid-state imaging device 41 for imaging an image has a Peltier element 42. The Peltier element 42 serves as an element for cooling the solid-state imaging device 41, and its COOL surface is closely attached to the solid-state imaging device 41 and its HOT surface is closely attached to a surface of a base 43a of an exterior unit 43, respectively.

The exterior unit 43 has the base 43a and an exterior cover 43b. The exterior cover 43b is provided so as to cover the periphery of the solid-state imaging device 41. The exterior cover 43b has a window unit 43e with opposed to the imaging surface of the solid-state imaging device 41. The exterior cover 43b is attached on the base 43a in airtight by a screw 43c with a packing 43d interposed therebetween. A cover glass 44 is disposed at the window unit 43e of the exterior cover 43b. The cover glass 44 adheres to the window unit 43e in airtight by means of an adhesive agent or the like. The lead wires 45 and 46 are connected to the solid-state imaging device 41 and the Peltier element 42, respectively. The lead wires 45 and 46 are guided to the outside penetrating through the base 43a of the exterior unit 43, and are connected to a power source (not shown) or the like. The base 43a through which the lead wires 45 and 46 penetrate are sealed by injecting a silicon resin or the like therein so as to prevent air from moving in and out. A silica gel 47 dries a space that is sealed by the exterior cover 43b including the solid-state imaging device 41.

According to the imaging apparatus configured as described above, the solid-state imaging device 41, of which temperature rises upon imaging, is cooled by the Peltier element 42. The Peltier element 42 radiates heat that is absorbed from the solid-state imaging device 41 to the exterior unit 43, and further, the exterior unit 43 radiates the heat to air.

However, the exterior unit 43 radiates the heat to air and simultaneously, also radiates the heat to an inner space of the exterior cover 43b including the solid-state imaging device 41. Therefore, the inside of the exterior cover 43b also rises in temperature, and as a result, an internal circulation of heat is generated to increase a temperature of the solid-state imaging device 41.

Cooling of the solid-state imaging device 41 is simply represented by the following expression.

Amount of cooling of solid-state imaging device (W)=amount of heat radiation to air−amount of internal circulation of heat As being obvious from this expression, for example, as shown in FIG. 2, Peltier output by the Peltier element 42 is increased, and as shown in FIG. 2A, a cooling temperature of the solid-state imaging device 41 is increased. As a result, the temperature of the exterior unit 43 is increased, and as shown in FIG. 2B, an amount of heat radiation to air is increased. However, as shown in FIG. 2C, an amount of internal circulation of heat within the exterior cover 43b is also increased, so that a cooling efficiency is deteriorated. If the Peltier output is further increased from this state, a difference ΔW between the amount of heat radiation to air and the amount of internal circulation of heat is saturated, and the cooling temperature of the solid-state imaging device 41 is also saturated.

Therefore, for example, technologies disclosed in Jpn. Pat. Appln. KOKAI Publication No. 7-211823 and Jpn. UM Appln. KOKOKU Publication No. 5-46381, respectively, are known.

FIG. 3 is a diagram showing a schematic configuration of an imaging apparatus disclosed in Jpn. Pat. Appln. KOKAI Publication No. 7-211823. In FIG. 3, the same parts as FIG. 1 are given the same reference numerals.

As shown in FIG. 3, a COOL surface of a second Peltier element 51 is closely attached to the outside surface of the base 43a of the exterior unit 43. On a HOT surface of the second Peltier element 51, a cooling wheel 52 is closely attached. Between the cooling wheel 52 and the outside surface of the base 43a, a heat insulator 53 is arranged so as to surround the second Peltier element 51. The base 43a, the heat insulator 53, and the cooling wheel 52 are fixed in one portion by a fixing screw 54. A lead wire 55 is connected to the second Peltier element 51.

According to such a configuration, it is possible to further radiate a portion of the heat radiation from the solid-state imaging device 41 to the exterior unit 43 via the Peltier element 42 to the cooling wheel 52.

Movement of heat in this case can be represented by the following expression.

Amount of cooling of solid-state imaging device (W)=amount of heat radiation to outside by cooling wheel+ amount of heat radiation to outside by exterior unit−internal circulation of heat Thereby, as the solid-state imaging device 41 is intensively cooled (output to the Peltier element 42 is increased), increasing amount of heat radiation to the cooling wheel 52 by the second Peltier element 51 and making the heat radiation by the exterior unit 43 even, the internal circulation of the heat is decreased. Thereby, a cooling efficiency of the solid-state imaging device 41 is improved so as to increase a cooling temperature.

On the other hand, FIG. 4 is a block schematic view of an imaging apparatus disclosed in Jpn. UM Appln. KOKOKU Publication No. 5-46381. In FIG. 4, the same parts as FIG. 1 are given the same reference numerals.

As shown in FIG. 4, a heat insulator 61 is disposed on the inside surface of the base 43a of the exterior unit 43 and the inside surface of the exterior cover 43b of the exterior unit 43.

According to such a configuration, due to a heat insulation effectiveness of the added heat insulator 61, a heat radiation amount to the inside of the exterior unit 43 can be decreased, and thereby, the internal circulation of the heat can be decreased. As a result, improving the cooling efficiency of the imaging device 41, the cooling temperature can be also increased.

BRIEF SUMMARY OF THE INVENTION

The present invention provides an imaging apparatus capable of improving a cooling efficiency of an imaging device and further, capable of preventing dew condensation to the imaging device.

An imaging device according to as aspect of the present invention is characterized by comprising: an imaging device which images an image; an exterior member which contains the imaging device; an interior member which is arranged inside of the exterior member and contains the imaging device; a heat insulator arranged between the exterior member and the interior member, for thermally insulating between the exterior member and the interior member; and a cooling unit configured to cool the imaging device and the interior member respectively and radiating heat that is absorbed from the imaging device and the interior member to the exterior member independently.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

With reference to the drawings, embodiments of the present invention will be described below.

FIRST EMBODIMENT

Figure 1:
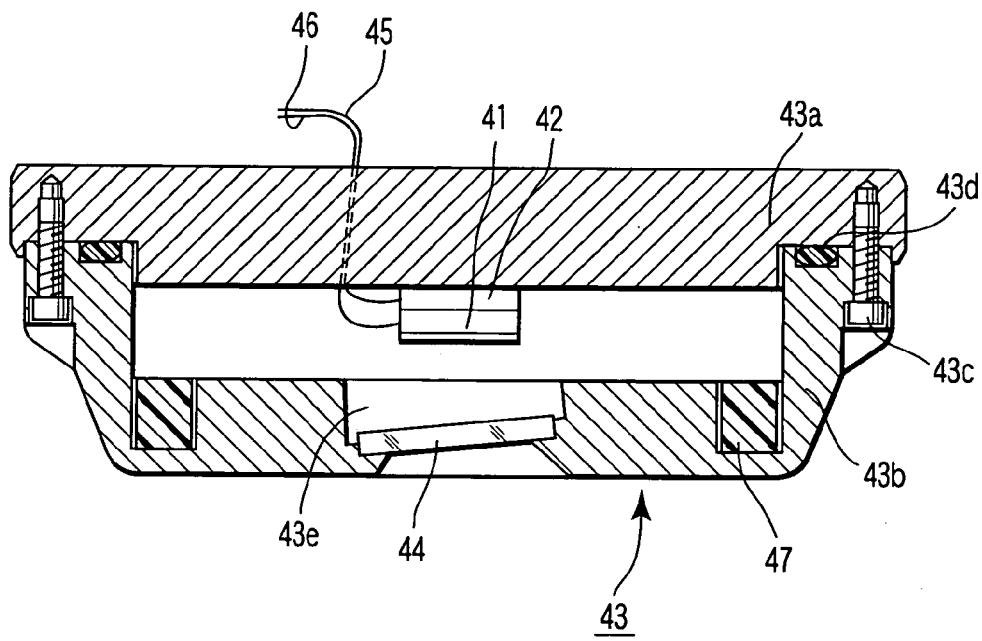
FIG. 1 is a diagram showing a schematic configuration of an example of a conventional imaging apparatus.
Figure 2:
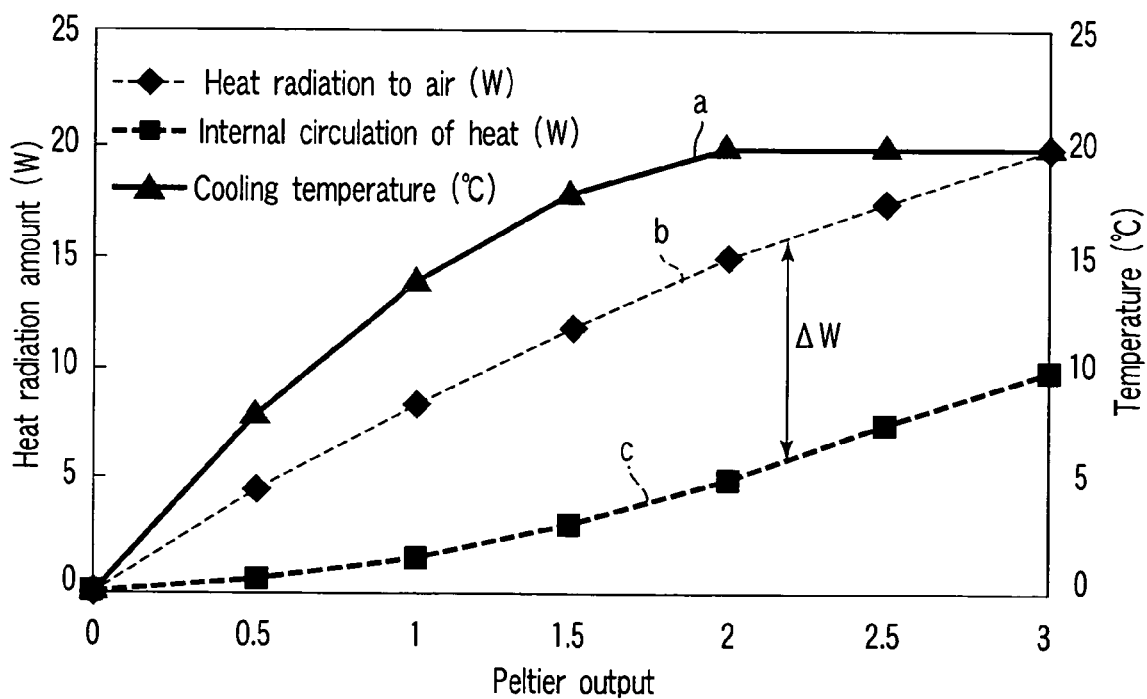
FIG. 2 is a view of an example of the conventional imaging apparatus.
Figure 3:
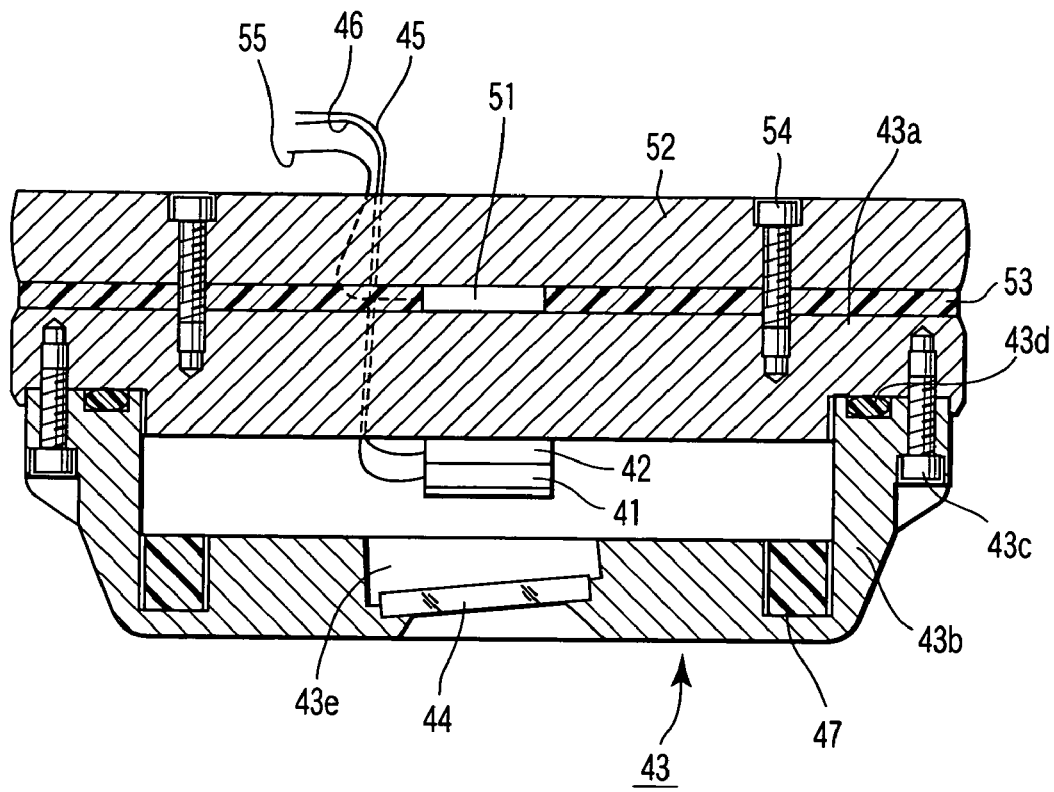
FIG. 3 is a diagram showing a schematic configuration of another example of the conventional imaging apparatus.
Figure 4:
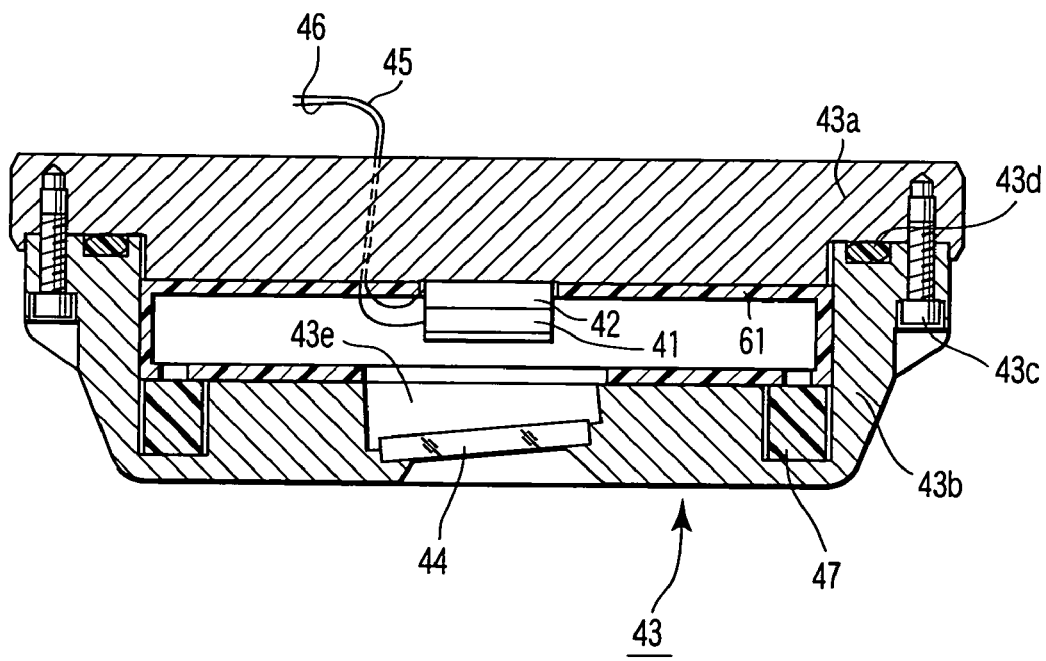
FIG. 4 is a diagram showing a schematic configuration of another example of the conventional imaging apparatus.
Figure 5:
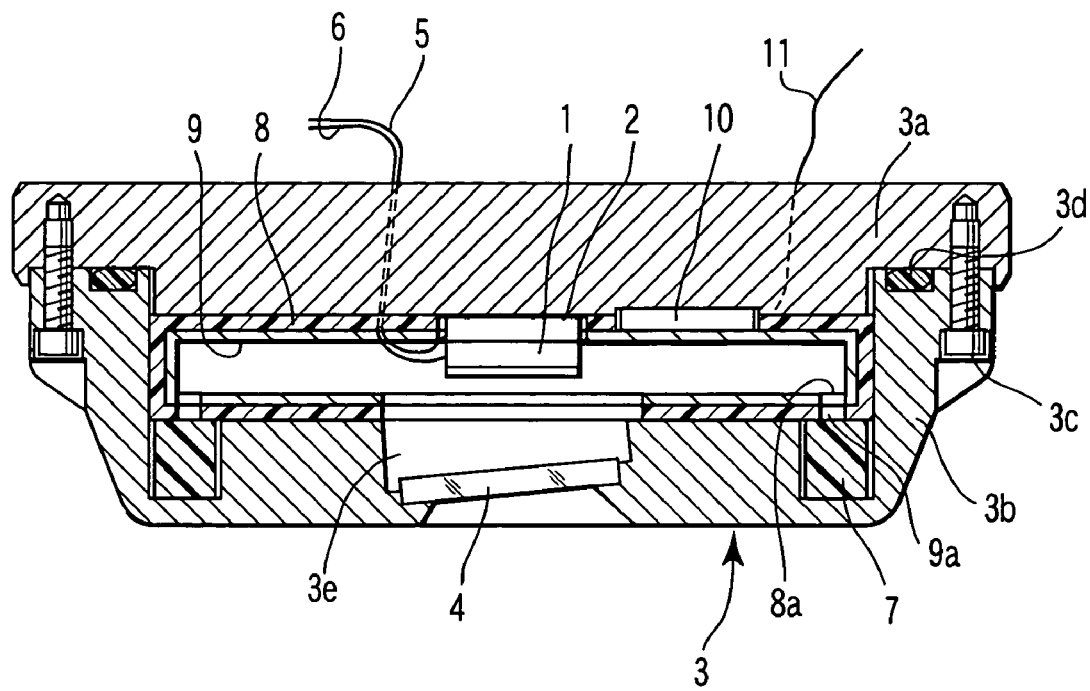
FIG. 5 is a diagram showing a schematic configuration of an imaging apparatus according to a first embodiment of the present invention.

FIG. 5 is a diagram showing a schematic configuration of an imaging apparatus to which the present invention is applied. In FIG. 5, a solid-state imaging device 1 for imaging an image as an imaging device has a first Peltier element 2 as cooling means. The first Peltier element 2 serves to cool the solid-state imaging device 1, and its COOL surface is closely attached to the solid-state imaging device 1 and its HOT surface is closely attached to a surface of a base 3a of an exterior unit 3 as an exterior member, respectively. The exterior unit 3 contains the solid-state imaging device 1 and has an exterior cover 3b to cover the periphery of the solid-state imaging device 1.

The exterior cover 3b has a window unit 3e with opposed to the imaging surface of the solid-state imaging device 1. The window unit 3e has a cover glass 4. The cover glass 4 adheres to the window unit 3e in airtight by means of an adhesive agent or the like. The exterior cover 3b is attached on the base 3a in airtight by a screw 3c via a packing 3d interposed therebetween. As the base 3a and the exterior cover 3b configuring the exterior unit 3, a material having a high heat conductivity, for example, aluminum or copper is used.

On the inside surfaces of the base 3a and the exterior cover 3b of the exterior unit 3, a heat insulator 8 as heat insulator is disposed. The heat insulator 8 thermally insulates between the exterior unit 3 and an internal cover 9 to be described later. As the heat insulator 8, a material having low heat conductivity, for example, a resin or the like is used.

On the inside surface of the heat insulator 8, the internal cover 9 as an interior member is arranged. Within the internal cover 9, the solid-state imaging device 1 is positioned. As the internal cover 9, a thin material having high heat conductivity is used. Such a material is used because an object of the present invention is not to cool the internal cover 9 itself but to absorb a heat from the parts or air within the internal cover 9.

Between the internal cover 9 and the base 3a of the exterior unit 3, a second Peltier element 10 as cooling means is arranged. The second Peltier element 10 serves to cool the internal cover 9, and its COOL surface is closely attached to the internal cover 9 and its HOT surface is closely attached to the surface of the base 3a, respectively.

The first and second Peltier elements 2 and 10, lead wires 5, 6 and 11 are connected to the solid-state imaging device 1, respectively. The lead wires 5, 6 and 11 are guided to the outside penetrating through the base 3a of the exterior unit 3, and are connected to a power source (not shown) or the like. The base 3a through which the lead wires 5, 6 and 11 penetrate are sealed by injecting a silicon resin or the like therein so as to prevent air from moving in and out through these penetrating portions.

The silica gel 7 dries a space that is sealed by the exterior cover 3b including the solid-state imaging device 1. On the heat insulator 8 and the internal cover 9, through holes 8a and 9a are formed in a portion corresponding to the silica gel 7.

In the imaging apparatus configured as described above, the solid-state imaging device 1, of which temperature rises upon imaging, is cooled by the first Peltier element 2. The first Peltier element 2 radiates heat that is absorbed from the solid-state imaging device 1 to the base 3a of the exterior unit 3. The exterior unit 3 radiates the heat from the first Peltier element 2 to air and also radiates the heat to the heat insulator 8. Then, the heat insulator 8 may radiate heat slightly to the side of the internal cover 9.

Under this state, if the internal cover 9 is cooled to the temperature that is lower than that of the solid-state imaging device 1 by the second Peltier element 10, the heat of the internal cover 9 is radiated to the exterior unit 3 by the second Peltier element 10. In this case, since the heat to be transmitted from the heat insulator 8 to the internal cover 9 is absorbed by the internal cover, the corresponding heat is entirely radiated to the exterior unit 3 without being radiated to a space within the internal cover 9. In addition, by cooling the inside of the internal cover 9 including the solid-state imaging device 1 to a temperature that is around and under that of the solid-state imaging device 1, a portion of radiation from the second Peltier element 10 is internally circulated via the exterior unit 3, the heat insulator 8, and the internal cover 9. However, by providing the heat insulator 8 between the exterior unit 3 and the internal cover 9, an amount of internal circulation of the heat is decreased.

Thus, if the temperature within the internal cover 9 is cooled to a temperature that is around and under that of the solid-state imaging device 1, the first Peltier element 2 dedicates oneself only to the solid-state imaging device 1, so that it is possible to cool the solid-state imaging device 1 to a further lower temperature. In addition, in the case of more cooling the solid-state imaging device 1, the output of the first Peltier element 2 may be increased. In this case, when the temperature of the exterior unit 3 is increased, the heat radiation to air is increased, and the heat radiation to the inside of the exterior unit 3 (the side of the internal cover 9) is also increased. However, the heat does not reach the solid-state imaging device 1, and as described above, the internal cover 9 absorbs heat to radiate it to the exterior unit 3. In addition, if a capacity of absorption heat of the internal cover 9 is short, the output of the second Peltier element 10 may be increased.

Accordingly, according to the first embodiment, even if the temperature of the exterior unit 3 is increased due to the heat radiation from the first Peltier element 2 to cool the solid-state imaging device 1, by cooling the internal cover 9 to a temperature lower than that of the solid-state imaging device 1 by means of the second Peltier element 10, the heat radiation to the inside of the exterior unit 3 (the side of the solid-state imaging device 1) can be absorbed by the internal cover 9, and further, the internal cover 9 and an inner air layer can be cooled. As a result, it is possible to maintain a low air temperature around the solid-state imaging device 1.

Conventionally, a portion of the heat radiation of the Peltier element is internally circulated or the heat radiation from air is absorbed by the Peltier element, so that all of performances of the Peltier element cannot be used to cool the solid-state imaging device. As compared to this, according to the present embodiment, all of performances of the first Peltier element 2 can be used to cool the solid-state imaging device 1, so that the present embodiment can improve the cooling efficiency of the solid-state imaging device 1 remarkably such that the solid-state imaging device 1 can be easily cooled to a desired low temperature.

Further, since it is possible to cool the internal cover 9 to a temperature that is lower than that of the solid-state imaging device 1 by the second Peltier element 10, and water within the internal cover 9 can be condensed on the internal cover 9, it is possible to reliably prevent dew condensation on the image pickup surface of the solid-state imaging device 1.

Moreover, as another means for dewy prevention, the first Peltier element 2 may be driven some time after the second Peltier element 10 is driven. In this case, water within the cover is condensed since the second Peltier element 10 is driven at first. Thereafter, when all extra water within the internal cover 9 has been condensed at the internal cover 9, the first Peltier element 2 is driven. Since all of the water within the cover is condensed on the internal cover 9, it is possible to prevent dew condensation of the image pickup surface of the solid-state imaging device 1. In this case, it is not needed to cool the internal cover 9 to a temperature that is lower than that of the solid-state imaging device 1.

SECOND EMBODIMENT

Next, a second embodiment of the present invention will be described below.

Figure 6:
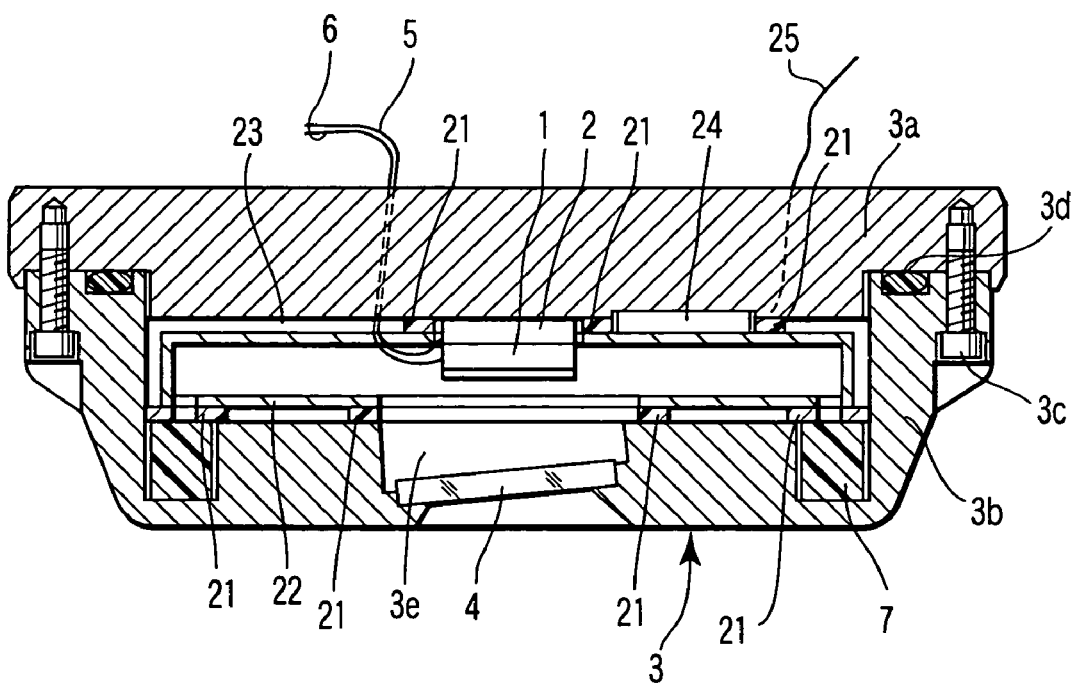
FIG. 6 is a diagram showing a schematic configuration of an imaging apparatus according to a second embodiment of the present invention.

FIG. 6 is a diagram showing a schematic configuration of the second embodiment of the invention. In FIG. 6, the same parts as FIG. 5 are given the same reference numerals.

On the inner surfaces of the base 3a and the exterior cover 3b of the exterior unit 3, an internal cover 22 is arranged via a spacer 21 made of a material having a high heat insulating efficiency. In other words, the spacer 21 is interposed between the exterior unit 3 and the internal cover 22 to form a narrow gap in an air layer 23 as heat insulating means. In this case, the air layer 23 is sealed with respect to an inner space of the internal cover 22.

Between the internal cover 22 and the base 3a of the exterior unit 3, a second Peltier element 24 is arranged. The second Peltier element 24 serves to cool the internal cover 22, and its COOL surface is closely attached to the internal cover 22 and its HOT surface is closely attached to the surface of the base 3a, respectively. In addition, a lead wire 25 of the second Peltier element 24 is guided to the outside penetrating through the base 3a of the exterior unit 3, and is connected to a power source (not shown) or the like. Also in this case, the base 3a through which the lead wire 24 penetrates is sealed by injecting a silicon resin or the like therein so as to prevent air from moving in and out therethrough.

Other parts are the same as FIG. 5, so that their explanations are herein omitted.

Also according to the present embodiment, even if the temperature of the exterior unit 3 is increased due to the heat radiation from the first Peltier element 2 to cool the solid-state imaging device 1, by cooling the internal cover 22 to a temperature lower than that of the solid-state imaging device 1 by means of the second Peltier element 24, the heat radiation to the inside of the exterior unit 3 (the side of the solid-state imaging device 1) can be absorbed by the internal cover 22, and further, the internal cover 22 itself and the inner air layer can be cooled. As a result, it is possible to maintain a low air temperature around the solid-state imaging device 1, and thereby, the same advantage as described in the first embodiment can be obtained.

According to the second embodiment, the air layer 23 is formed between the exterior unit 3 and the internal cover 22 via the spacer 21. However, by forming a layer having a vacuum layer and a nitrogen gas filled therein in place of this air layer 23 as heat insulating means, the same advantage can be obtained.

The present invention is not limited to the above-described embodiments, and in an implementation phase, various modifications of the present invention can be made without changing its spirit.

Further, the above-described embodiments include the inventions at various phases, and various inventions can be extracted by an appropriate combination of plural constituent features that are disclosed here. For example, even if some constituent features are deleted from among all constituent features that are disclosed in the embodiments, it is possible to solve the problems described in "Problems to be Solved by the Invention", and if the advantages described in "Advantages of the Invention" can be obtained, the configuration having this constituent feature deleted can be extracted as the invention.

According to the invention, even if a temperature of the exterior member is increased due to cooling of the imaging device, the heat radiation from the exterior member to the inside can be absorbed by the interior member. Further, by cooling the interior member, the air inside the interior member is cooled and the air temperature around the imaging device can be maintained lower. As a result, it is possible to easily cool the imaging device to a desired low temperature and the cooling efficiency of the imaging device can be improved remarkably.

In addition, according to the invention, by cooling the cooled temperature of the interior member than that of the temperature of the imaging pickup device, it is possible to condense a dew inside the interior member on the interior member, so that it is possible to prevent the dew condensation on the imaging device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging apparatus comprising:
   an imaging device which images an image;
   an exterior member which contains the imaging device;
   an interior member which is arranged inside of the exterior member and contains the imaging device;
   a heat insulator arranged between the exterior member and the interior member, for thermally insulating between the exterior member and the interior member; and
   a cooling unit configured to cool the imaging device and the interior member respectively and radiating heat that is absorbed from the imaging device and the interior member to the exterior member independently.

2. The imaging apparatus according to claim 1, wherein the heat insulator includes one of a heat insulator, a vacuum layer, and a layer having gas filled therein.

3. The imaging apparatus according to claim 2, wherein the cooling unit includes first and second Peltier elements, and a cooled temperature of the interior member by the second Peltier element is set lower than a cooled temperature of the imaging device by the first Peltier element.

4. The imaging apparatus according to claim 3, wherein the first Peltier element is driven after lapse of a predetermined time after driving the second Peltier element.

5. The imaging apparatus according to claim 1, wherein the cooling unit includes first and second Peltier elements, and the first Peltier element radiates the heat that is absorbed from the imaging device to the exterior member, and the second Peltier element radiates the heat that is absorbed from the interior member to the exterior member.

6. The imaging apparatus according to claim 5, wherein a cooled temperature of the interior member by the second Peltier element is set lower than a cooled temperature of the imaging device by the first Peltier element.

7. The imaging apparatus according to claim 5, wherein the first Peltier element is driven after lapse of a predetermined time after driving the second Peltier element.

8. The imaging apparatus according to claim 5, wherein the heat insulator includes one of a heat insulator, a vacuum layer, and a layer having gas filled therein.

9. The imaging apparatus according to claim 8, wherein a cooled temperature of the interior member by the second Peltier element is set lower than a cooled temperature of the imaging device by the first Peltier element.

10. The imaging apparatus according to claim 8, wherein the first Peltier element is driven after lapse of a predetermined time after driving the second Peltier element.

* * * * *